(12) United States Patent
Paseuth et al.

(10) Patent No.: US 11,591,695 B2
(45) Date of Patent: Feb. 28, 2023

(54) SURFACE COATED MEMBER AND METHOD FOR MANUFACTURING SAME

(71) Applicant: SUMITOMO ELECTRIC HARDMETAL CORP., Itami (JP)

(72) Inventors: Anongsack Paseuth, Itami (JP); Kazuo Yamagata, Itami (JP); Susumu Okuno, Itami (JP); Hideaki Kanaoka, Itami (JP); Hiroyuki Morimoto, Itami (JP); Minoru Itoh, Sorachi-gun (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 578 days.

(21) Appl. No.: 16/596,984

(22) Filed: Oct. 9, 2019

(65) Prior Publication Data

US 2020/0040462 A1 Feb. 6, 2020

Related U.S. Application Data

(63) Continuation of application No. 14/654,937, filed as application No. PCT/JP2013/080395 on Nov. 11, 2013, now abandoned.

(30) Foreign Application Priority Data

Dec. 28, 2012 (JP) ................................. 2012-287499

(51) Int. Cl.
  *B32B 15/04* (2006.01)
  *B32B 17/06* (2006.01)
  (Continued)

(52) U.S. Cl.
  CPC ............ *C23C 28/042* (2013.01); *C23C 16/34* (2013.01); *C23C 16/40* (2013.01); *C23C 16/56* (2013.01);
  (Continued)

(58) Field of Classification Search
  CPC ........ C23C 16/40; C23C 28/048; C23C 28/42
  (Continued)

(56) References Cited

U.S. PATENT DOCUMENTS 5,266,389 A  11/1993 Omori et al.
5,503,912 A  4/1996 Setoyama et al.
(Continued)

FOREIGN PATENT DOCUMENTS

CN  1620349 A  5/2005
CN  1962926 A  5/2007
(Continued)

OTHER PUBLICATIONS

International Search Report in PCT International Application No. PCT/JP2013/080395, dated Feb. 4, 2014. [Cited in Parent].
(Continued)

*Primary Examiner* — Lauren R Colgan
(74) *Attorney, Agent, or Firm* — Baker Botts L.L.P.; Michael A. Sartori

(57) ABSTRACT

A surface coated member having improved stability and a longer service life is provided. The surface coated member includes a base member and a hard coating formed on a surface thereof. The hard coating is constituted of one or more layers. At least one layer among the layers is a layer including hard particles. The hard particles include a multilayer structure having a first unit layer and a second unit layer being layered alternately. The first unit layer includes a first compound. The second unit layer includes a second compound. The first compound and the second compound are respectively made of one or more kind of element selected from the group consisting of a group 4 element, a group 5 element, a group 6 element of a periodic table, and Al, and one or more kind of element selected from the group consisting of B, C, N, and O.

6 Claims, 1 Drawing Sheet

(51) Int. Cl.
  *C23C 28/04* (2006.01)
  *C23C 16/56* (2006.01)
  *C23C 16/34* (2006.01)
  *C23C 28/00* (2006.01)
  *C23C 16/40* (2006.01)

(52) U.S. Cl.
  CPC .......... *C23C 28/044* (2013.01); *C23C 28/048* (2013.01); *C23C 28/42* (2013.01); *Y10T 428/25* (2015.01); *Y10T 428/257* (2015.01)

(58) Field of Classification Search
  USPC ........................................................ 428/698
  See application file for complete search history.

(56) References Cited

U.S. PATENT DOCUMENTS

| | | | |
|---|---|---|---|
| 5,700,551 | A | 12/1997 | Kukino et al. |
| 7,060,345 | B2 | 6/2006 | Fukui et al. |
| 10,100,403 | B2 * | 10/2018 | Paseuth .................. C23C 16/34 |
| 10,166,611 | B2 | 1/2019 | Paseuth et al. |
| 10,252,343 | B2 | 4/2019 | Paseuth et al. |
| 10,259,048 | B2 | 4/2019 | Paseuth et al. |
| 2005/0042482 | A1 | 2/2005 | Okada et al. |
| 2005/0158590 | A1 | 7/2005 | Li |
| 2008/0073127 | A1 | 3/2008 | Zhan et al. |
| 2009/0123779 | A1 | 5/2009 | Endler |
| 2010/0215912 | A1 | 8/2010 | Kubota et al. |
| 2011/0003126 | A1 | 1/2011 | Van Den Berg et al. |
| 2012/0282050 | A1 | 11/2012 | Setoyama et al. |
| 2015/0064452 | A1 | 3/2015 | Pitonak et al. |
| 2019/0151956 | A1 | 5/2019 | Paseuth et al. |

FOREIGN PATENT DOCUMENTS

| | | |
|---|---|---|
| CN | 101855035 A | 10/2010 |
| CN | 102666437 A | 9/2012 |
| EP | 2011894 A1 | 1/2009 |
| JP | 07-205362 A | 8/1995 |
| JP | 11-350139 A | 12/1999 |
| JP | 2008-093770 A | 4/2008 |
| JP | 2008-545063 A | 12/2008 |
| JP | 2010-046757 A | 3/2010 |
| JP | 2010-131741 A | 6/2010 |
| WO | 2012/177278 A1 | 12/2012 |
| WO | 2013/134796 A1 | 9/2013 |

OTHER PUBLICATIONS

Notification of the First Office Action in Chinese Patent Application No. 201380068256.X, dated May 23, 2016. [Cited in Parent].
Extended European Search Report in European Patent Application No. 13869621.6, dated Jun. 30, 2016. [Cited in Parent].
Grounds for Rejection in counterpart Korean Patent Application No. 9-5-2016-065972934, dated Sep. 13, 2016. [Cited in Parent].
Office Action in counterpart European Patent Application No. 13869621.6, dated Jan. 9, 2017. [Cited in Parent].
Machine translation of JP 07-205362, Aug. 8, 1995, pp. 1-4. [Cited in Parent].
Oxford English Dictionary—Element definition, Oxford University Press, second edition (Year: 1989). [Cited in Parent].
Examiner's Answer issued in U.S. Appl. No. 14/654,937 dated Jun. 12, 2020.
M. Setoyama, et al., "Formation of cubic-AlN in TiN/AlN superlattice," Surface and Coatings Technology, 86-87 (1996), pp. 225-230.

* cited by examiner

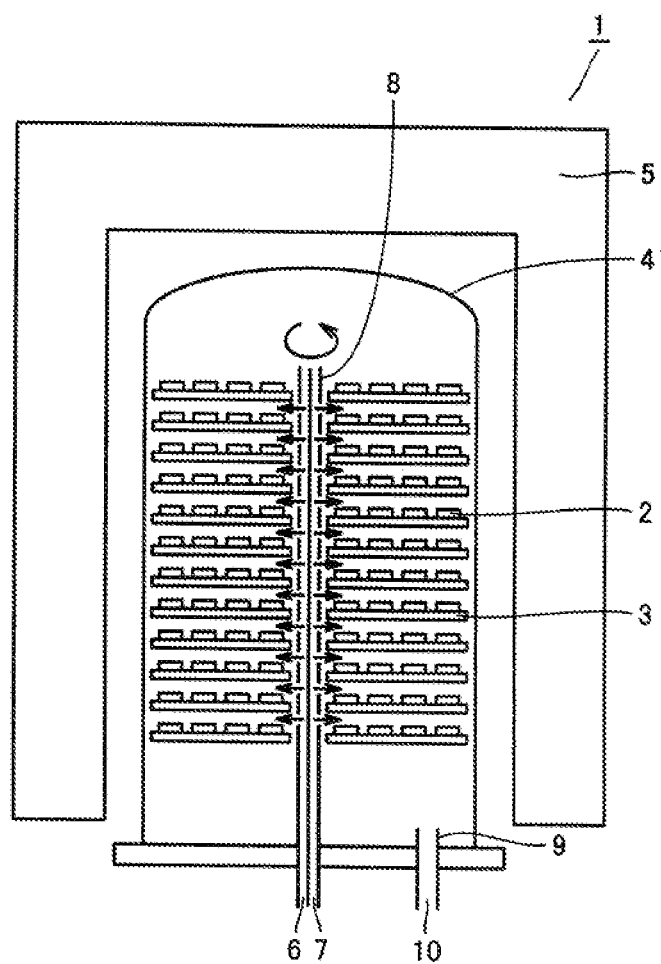

SURFACE COATED MEMBER AND METHOD FOR MANUFACTURING SAME

TECHNICAL FIELD

The present invention relates to a surface coated member including a base member and a hard coating formed on a surface thereof, and a method for manufacturing the same.

BACKGROUND ART

As a recent technical trend, producing a thinner and shorter surface coated member for a cutting tool or the like is on the main stream for the purpose of reducing a load on a global environment and efficiently utilizing a resource. Accordingly, providing a metal material having a higher strength and higher hardness used for a surface coated member is proceeding to secure a service life of a surface coated member and maintain its reliability. On the other hand, at metal working sites, it has been strongly requested to achieve improved accuracy of a worked part and reduced working cost to compete with newly emerging countries. Further, with the improvement in the performance of machining tools, the expectation for further high-speed working with a surface coated member is increasing. In the high-speed working, since a cutting edge of a surface coated member is exposed to a high-temperature and high-pressure environment, a surface coated member capable of having a longer service life even under a harsh environment will be requested in the future.

For example, Japanese Patent Laying-Open No. 7-205362 (PTD 1) discloses a hard coating which coats a surface of a base member of a surface coated member. In the hard coating, the composition thereof is changed continuously with nitride, carbide, carbonitride, or boride of two or more kinds of elements selected from group 4, 5, 6 elements, Al, and Si at a cycle of 0.4 nm to 50 nm. The above-described hard coating is formed by a PVD (Physical Vapor Deposition) method. Specifically, TiN layers and AlN layers are formed continuously on a base material surface with use of solid Ti, solid Al, and $N_2$ gas by bringing Ti ion and Al ion, which are generated by a vacuum discharge, and $N_2$ gas to be in contact with a base member heated to 500° C. Since the hard coating formed by this method has a large distortion in its structure, a surface coated member having this hard coating can have a superior wear resistance and toughness.

Moreover, for example, Japanese National Patent Publication No. 2008-545063 (PTD 2) discloses a member having a $Ti_{1-x}Al_xN$ coating as a surface coated member. This $Ti_{1-x}Al_xN$ coating has a single layer structure of a cubic crystal NaCl structure having a stoichiometric coefficient of $0.75<x\le0.93$ and having a lattice constant afcc of 0.412 nm to 0.405 nm. The above-described $Ti_{1-x}Al_xN$ coating is formed by a CVD (Chemical Vapor Deposition) method. Specifically, a first gas mixture constituted of $AlCl_3$, $TiCl_4$, $H_2$, and argon and a second gas mixture constituted of $NH_3$ and $N_2$ as a nitrogen source are introduced into a CVD reactor vessel of a hot wall type accommodating a base member to perform a thermal CVD method. The above-described coating formed by this method has a higher Al content in the coating as compared to the $Ti_{1-x}Al_xN$ coating produced by a generally known PVD method. Therefore, a surface coated member having this coating has a higher oxidation resistance and a higher hardness and can exhibit a superior wear resistance at a high temperature.

CITATION LIST

Patent Documents

PTD 1: Japanese Patent Laying-Open No. 7-205362
PTD 2: Japanese National Patent Publication No. 2008-545063

SUMMARY OF INVENTION

Technical Problem

However, as to PTD 1, there is a case where the hard coating formed by the PVD method contains impurities such as metals of Ti, Al, and alloy of those. Such impurities are referred to as droplets, which inhibit formation of the hard coating and causes falling of the hard coating during metal working. Moreover, from the part where the hard coating has fallen as a starting point, chipping, fracture, and the like of the hard coating is likely to occur. Consequently, it becomes difficult to obtain a longer service life of a surface coated member, and there is a case where the work quality and surface roughness of the work material are deteriorated.

Moreover, as to PTD 2, although the $Ti_{1-x}Al_xN$ coating has a stoichiometric coefficient of $0.75<x\le0.93$, generally, there is a tendency to cause a large distortion in a crystal structure when x is greater than 0.7 in this composition. It is well known that a $Ti_{1-x}Al_xN$ crystal of a cubic crystal NaCl structure is modified into a hexagonal crystal wurtzite structure to mitigate the distortion. Particularly, there is a tendency that this modification is accelerated at a high temperature.

During the metal working, a cutting tool and a work material repeat contact and release, and a load is applied to a surface of a cutting edge of the surface coated member in the cycles of heating and cooling. Therefore, a great thermal load is applied all the time to the surface coated member during the metal working, and a thermal fatigue occurs. This thermal fatigue accelerates the above-described modification. Further, along with the repeated cutting, the hard coating which has once modified is likely to cause chipping and fracture. Therefore, also in the technique disclosed in PTD 2, there is a limit on a longer service life of a surface coated member in a high-speed working.

The present invention was made in view of the circumstance described above, and its object is to provide improved stability and a longer service life to a surface coated member and to provide a method for manufacturing the same.

Solution to Problem

The present invention concerns a surface coated member including a base member and a hard coating formed on a surface thereof. The hard coating is constituted of one or more layers. At least one layer among the above-described layers is a layer including hard particles. The hard particles include a multilayer structure having first unit layers and second unit layers being layered alternately. The first unit layer includes a first compound. The first compound is made of one or more kind of element selected from the group consisting of a periodic table group 4 element, a periodic table group 5 element, a periodic table group 6 element, and Al, and one or more kind of element selected from the group consisting of B, C, N, and O. The second unit layer includes a second compound. The second compound is made of one or more kind of element selected from the group consisting of a periodic table group 4 element, group 5 element, group 6 element, and Al, and at least one element selected from the group consisting of B, C, N, and O.

Preferably, the above-described surface coated member includes an intermediate layer between the first unit layer and the second unit layer, and a composition of the intermediate layer is changed continuously in its thickness direction from a composition of the first compound to a composition of the second compound.

Preferably, in the above-described surface coated member, the layer including hard particles includes a grain boundary layer in a grain boundary of the hard particles, said grain boundary layer including the first compound or the second compound.

Moreover, the present invention concerns a method for manufacturing a surface coated member including a base member and a hard coating. The hard coating is formed on a surface of the base member and constituted of one or more layers. The method includes a CVD step of forming at least one layer among the above-described layers by a CVD method. The CVD step includes an ejection step of ejecting a mixture gas, containing two or more kinds of elements selected from the group consisting of a periodic table group 4 element, a periodic table group 5 element, a periodic table group 6 element, and Al, and one or more kind of element selected from the group consisting of B, C, N, and O, to the surface of the base member, and a cooling step of cooling the base member after the ejection step.

Preferably, in the above-described manufacturing method, the base member is cooled at a rate greater than or equal to 7° C./min in the cooling step.

Advantageous Effects of Invention

According to the surface coated member of the present invention, the various characteristics such as a wear resistance and a welding resistance are improved. Therefore, it exhibits a superior effect of having improved stability and a longer service life. Moreover, according to the method for manufacturing a surface coated member of the present invention, various characteristics such as a wear resistance and a welding resistance are improved, so that a surface coated member having improved stability and a longer service life can be manufactured.

BRIEF DESCRIPTION OF DRAWINGS

FIG. 1 is a schematic cross-sectional view representing a CVD device used in a CVD step of the present invention.

DESCRIPTION OF EMBODIMENT

Hereinafter, the present invention will be described in detail.

<Surface Coated Member>

A surface coated member of the present invention has a configuration including a base member and a hard coating formed on a surface thereof. Preferably, such a coating coats an entire surface of the base member. However, even when a part of the base member is not coated with this coating, or a configuration of the coating is partially different, it does not depart from the scope of the present invention.

Examples of such a surface coated member of the present invention include a cutting tool, a wear resistant tool, a mold component, an automobile part, and the like. Among those, the surface coated member can be suitably used as a cutting tool such as a drill, an end mill, a cutting edge replaceable-type cutting tip for a drill, a cutting edge replaceable-type cutting tip for an end mill, a cutting edge replaceable-type cutting tip for milling, a cutting edge replaceable-type cutting tip for turning, a metal saw, a gear cutting tool, a reamer, a tap, or the like.

<Base Member>

The base member used in the surface coated member of the present invention can be anything as long as it has been conventionally known as a base member of this kind. For example, it is preferable that the base member is made of any of cemented carbide (for example, WC-base cemented carbide or a material containing WC and Co or carbonitride of Ti, Ta, Nb, or the like), a cermet (mainly composed of TiC, TiN, TiCN, or the like), a high-speed steel, a ceramic material (titanium carbide, silicon carbide, silicon nitride, aluminum nitride, aluminum oxide, and the like), a cubic crystal boron nitride sintered body, and a diamond sintered body.

Among those various kinds of base members, it is particularly preferable to select WC-based cemented carbide or a cermet (particularly, TiCN-base cermet). This is because these base members are particularly superior in balance between a hardness and a strength at a high temperature and have superior characteristics as a base member of a surface coated member for the above-described application.

It should be noted that, when the surface coated member is a cutting edge replaceable-type cutting tip or the like, such a base member includes the one having a chip breaker and the one having no chip breaker, and a cutting-edge ridgeline portion has a shape including a sharp edge (a ridge at which a cutting face and a flank intersect), a honing (the one having an R shape given to a sharp edge), a negative land (the beveled one), and a combination of the honing and negative land.

<Hard Coating>

The hard coating of the present invention is constituted of one or more layers, and at least one among the layers is a layer including hard particles. Preferably, the hard coating of the present invention has a thickness of 3 to 30 µm. When the thickness is less than 3 µm, there is a case where a wear resistance is not sufficient. When the thickness exceeds 30 µm, there is a case where peeling or breaking of the hard coating occurs frequently due to a great stress applied between the hard coating and the base member during the intermittent working.

In the hard coating of the present invention, other layer may be included as long as at least one layer of hard particles is included. Other layers may include, for example, an $Al_2O_3$ layer, a $TiB_2$ layer, a TiBN layer, an AlN layer (wurtzite type), a TiN layer, a TiCN layer, a TiBNO layer, a TiCNO layer, a TiAlN layer, a TiAlCN layer, a TiAlON layer, a TiAlONC layer, and the like.

For example, adhesion between the base member and the hard coating can be improved by including the TiN layer, TiC layer, TiCN layer, or TiBN layer as a base layer directly above the base member. Moreover, the oxidation resistance of the hard coating can be improved by including the $Al_2O_3$ layer. Moreover, including an outermost layer made of the TiN layer, TiC layer, TiCN layer, TiBN layer, or the like can provide a distinctive characteristic on whether or not the cutting edge of the surface coated member is used. It should be noted that other layer may be typically formed to have a thickness of 0.1 to 10 µm.

It should be noted that, in the present invention, when the composition of each layer constituting the hard coating is expressed by the chemical formula such as "TiN" and "TiCN," the chemical formula not particularly specifying an atomic ratio does not indicate that the atomic ratio of each element is only "1" but includes all of the conventionally known atomic ratio.

Moreover, the hard coating of the present invention can have an indentation hardness greater than or equal to 3000 kgf/mm$^2$. It should be noted that the indentation hardness can be measured by cutting a sample along a flat plane including a normal line with respect to the surface of the hard coating of the cutting tool and pressing an indentor at a load of 25 gmHv with respect to a hard particle layer in a direction perpendicular to the cut plane.

<Layer Including Hard Particles>

The hard coating of the present invention is constituted of one or more layers, and at least one layer among the layers is a layer including hard particles (hereinafter, also referred to as "hard particle layer"). The hard particle layer of the present invention suitably has a thickness greater than or equal to 1 μm and less than or equal to 20 μm, more preferably greater than or equal to 1 μm and less than or equal to 15 μm. When the thickness is less than 1 μm, there is a case where the wear resistance is insufficient. When the thickness exceeds 20 μm, there is a case where peeling or breaking of the hard coating frequently occurs due to a great stress applied to the hard coating and the base member during the intermittent working. It should be noted that, even when the hard particle layer of the present invention partially includes the configuration other than the hard particles, for example, includes an amorphous phase or a wurtzite hard phase, it does not depart from the scope of the present invention as long as the effect of the present invention is exhibited.

<Hard Particles>

The hard particles of the present invention include a multilayer structure having the first unit layers and the second unit layers being layered alternately. It should be noted that, even when the hard particles of the present invention partially include the configuration other than the multilayer structure, for example, include an amorphous phase or a wurtzite hard phase, it does not depart from the scope of the present invention as long as the effect of the present invention is exhibited.

The above-described first unit layer includes a first compound made of one or more kind of element selected from the group consisting of a periodic table group 4 element, a periodic table group 5 element, a periodic table group 6 element, and Al, and one or more kind of element selected from the group consisting of B, C, N, and O. The above-described second unit layer includes a second compound made of one or more kind of element selected from the group consisting of a periodic table group 4 element, a periodic table group 5 element, a periodic table group 6 element, and Al, and one ore more kind of element selected from the group consisting of B, C, N, and O. It goes without saying that the composition of the first compound and the composition of the second compound are different.

The first compound and second compound made of one or more kind of element selected from the group consisting of a periodic table group 4 element, a periodic table group 5 element, a periodic table group 6 element, and Al, and one or more kind of element selected from the group consisting of B, C, N, and O respectively include TiC, TiN, TiCN, TiNO, TiCNO, TiB$_2$, TiO$_2$, TiBN, TiBNO, TiCBN, ZrC, ZrO$_2$, HfC, HfN, TiAlN, TiAlCrN, TiZrN, TiCrN, AlCrN, CrN, VN, N, AlTiCrN, TiAlCN, ZrCN, ZrCNO, Al$_2$O$_3$, AlN, AlCN, ZrN, TiAlC, NbC, NbN, NbCN, Mo$_2$C, WC, W$_2$C and the like. It should be noted that even when inevitable impurities are included in the first compound and second compound, it does not depart from the scope of the present invention.

The first unit layer and second unit layer of the present invention may have a configuration of a single composition or a configuration in which respective compositions are changed in the respective thickness directions. Such a configuration in which the composition is changed will be described for easy understanding by referring to the case where the composition at a midpoint in the thickness direction of the first unit layer is Al$_{0.9}$Ti$_{0.1}$N and where the composition at a midpoint in the thickness direction of the second unit layer is Al$_{0.1}$Ti$_{0.9}$N.

In the above-described case, the first unit layer, as to its composition in the thickness direction, contains Al$_{0.9}$Ti$_{0.1}$N at the midpoint, and the composition can be changed, from the midpoint to the side in contact with the adjacent second unit layer, into the composition having the atomic ratio of Al being gradually reduced from Al$_{0.9}$Ti$_{0.1}$N. Moreover, the second unit layer, as to its composition in the thickness direction, contains Al$_{0.1}$Ti$_{0.9}$N at the midpoint, and the composition can be changed, from the midpoint to the side in contact with the adjacent first layer, into the composition having the atomic ratio of Ti being gradually reduced from Al$_{0.1}$Ti$_{0.9}$N. In other words, in this case, there is no clear boundary in the composition between the first unit layer and the second unit layer.

Moreover, in the above-described multilayer structure, the thickness in the layer cycle is preferably greater than or equal to 0.5 nm and less than or equal to 20 nm. It is difficult to set the layer cycle to be less than 0.5 nm in the sense of manufacturing technique. This is because, when the layer cycle exceeds 20 nm, the distortion between the unit layers is alleviated, and the superior characteristic as the hard phase is deteriorated. Herein, the thickness of the layer cycle represents a distance from one first unit layer to other adjacent first unit layer across the second unit layer adjacent to the one first unit layer (when an intermediate layer described later is included between the first unit layer and the second unit layer, the intermediate layer adjacent to the second unit layer is included). It should be noted that this distance is a distance connecting midpoints of each of the first unit layer and the other first unit layer in the thickness direction of each layer.

The number of layers (the total number of layers) constituting this multilayer structure layer is not particularly limited but is preferably greater than or equal to 10 layers and less than or equal to 1000 layers. This is because, when the number of layers is less than 10 layers, the crystal grains in each layer become coarse and large, so that there is a case where the hardness of the hard particles is lowered, and it shows a tendency that each unit layer becomes thinner when the number exceeds 1000 layers and each of the layers is mixed.

It should be noted that the multilayer structure and the particle diameter of the hard particles can be confirmed by means of a scanning electron microscope (SEM), a transmission electron microscope (TEM), a scanning electron microscope energy dispersive X-ray spectroscopy (EDX), an X-ray diffraction method, and the like. Since it is difficult to obtain hard particles having a particle diameter of less than 10 nm in the sense of manufacturing technique, and the particles having a particle diameter larger than 1000 nm causes falling and chipping, the particle diameter of hard particles is preferably greater than or equal to 10 nm and less than or equal to 1000 nm.

In the present invention, the cause of improvement in the various characteristics such as the wear resistance and the welding resistance of the surface coated member by coating the base member with hard coating including a hard particle layer is unknown, but the following cause is presumed. In other words, among the plurality of layers constituting the hard coating, at least one of the layers is constituted of a hard particle layer, so that the hard coating can have a region of a granular structure in its thickness direction. Accordingly, the toughness of the hard coating is improved. Moreover, even when a crack occurs on the surface of the hard coating, development of the crack into the base member can be suppressed effectively. Then, this effect is particularly fostered when each particle in the granular structure has a multilayer structure.

<Intermediate Layer>

The hard coating of the present invention can include an intermediate layer between the first unit layer and the second unit layer. The composition of this intermediate layer is changed continuously in its thickness direction from the composition of the first compound to the composition of the second compound from the side in contact with the first unit layer to the side in contact with the second unit layer. For example, in the case where the composition of the first compound is TiN and where the composition of the second compound is AlN, the intermediate layer can have the configuration having an atomic ratio of Ti reduced and an atomic ratio of Al increased from the side in contact with the first unit layer to the side in contact with the second unit layer. Moreover, for example, in the case where the first compound is TiAlN and where the second compound is AlN, the intermediate layer can have the configuration having an atomic ratio of at least Ti reduced continuously from the side in contact with the first unit layer to the side in contact with the second unit layer.

Moreover, the thickness of the intermediate layer is not particularly limited. For example, the thickness of the intermediate layer may be substantially equal to or smaller than the thickness of the first unit layer or second unit layer. Moreover, the thickness of the intermediate layer may be exceedingly greater than the respective thickness of the first unit layer or second unit layer. In other words, the thickness of the first unit layer and second unit layer may be exceedingly smaller than the intermediate layer.

In the present invention, the hard particle layer includes the intermediate layer between the first unit layer and the second unit layer, so that various characteristics such as the wear resistance and chipping resistance of the surface coated member further improves. However, the cause is not clear. For example, it is considered that the cause is related to the fact that a large distortion is accumulated in the hard particle layer since providing the intermediate layer changes the composition continuously between the first unit layer and the second unit layer. Moreover, it is considered that the cause is related to the fact that, since the layer becomes more thermally stable, the modification due to a thermal shock becomes more unlikely to occur, and the adhesion strength with the first unit layer and the second unit layer becomes higher due to the presence of the intermediate layer.

Moreover, the intermediate layer can be recognized as the first unit layer and/or second unit layer. For example, the case is assumed where the first compound is TiN, and the second compound is AlN, and the composition of the intermediate layer is $Ti_xAl_yN$, and the atomic ratio x of Ti decreases continuously from 1 to 0 and the atomic ratio y of Al continuously increases from 0 to 1 from the side in contact with the first unit layer to the side in contact with the second unit layer. In this case, for example, in the intermediate layer, the region having the atomic ratio x/y of Ti and Al is greater than or equal to 1 can be recognized as the first unit layer, and the region having the atomic ratio x/y of less than 1 can be considered as the second unit layer. In this case, the first unit layer and second unit layer have no clear boundary. It should be noted that, when the thickness of the first unit layer and/or second unit layer is exceedingly smaller than the intermediate layer, the region including the first compound in the first unit layer becomes a maximum point of the Ti concentration in the thickness direction of the layer cycle, and the region including the second compound in the second unit layer becomes a maximum point of the Al concentration in the thickness direction of the layer cycle.

<Preferable Structure of Hard Particle Layer>

Moreover, in the hard particle layer of the present invention, preferably, the first compound and second compound are $Ti_xAl_yN$ respectively (however, the values of x and y are different respectively in the first compound and second compound), and more preferably, TiN and AlN. Although the cause of this is not clear, the following cause is presumed. In other words, in this case, the first compound and second compound can be TiN having an fcc crystal structure (in the following, also referred to as "fcc-TiN") and AlN having an fcc crystal structure (in the following, also referred to as "fcc-AlN"), and the intermediate layer can change the composition in its thickness direction significantly. In such a configuration, being different from the layer such as $fcc-Ti_{0.1}Al_{0.9}N$ having an even composition, distortion caused by the difference in the thermal expansion coefficient is present in the layer. With the presence of this distortion, a shift from the fcc crystal structure to an hcp crystal structure caused by a thermal load becomes particularly unlikely to occur. Consequently, the various characteristics such as the wear resistance and welding resistance improve.

The matter which should be focused is that, when the thickness of the layer cycle exceeds 100 nm, AlN of the mechanically stable hexagonal crystal wurtzite structure is precipitated, and the above-described superior characteristics are deteriorated.

<Grain Boundary Layer>

The hard particle layer of the present invention can have a grain boundary layer constituted of the first compound or second compound at the grain boundary between the hard particles, in other words, at the upper most surface of the hard particles. For example, in the case where the first compound and second compound are TiN and AlN respectively, the composition of the grain boundary layer is TiN or AlN. Having this grain boundary layer further improves the various characteristics such as the wear resistance and chipping resistance of the surface coated member. However, the cause of it is not clear. For example, it is surmised that the presence of the grain boundary layer improves the heat resistance of the hard particles, or the excessive particle growth of the hard particles is suppressed. It should be noted that, as to the grain boundary layer, the thickness thereof is preferably greater than or equal to 10 nm and less than or equal to 100 nm in view of the balance between the strength and toughness.

As described above in detail, according to the surface coated member of the present invention, the base member is coated with a hard coating including the hard particle layer, so that the various characteristics such as the wear resistance and welding resistance of the surface coated member improves. Thus, the present invention can provide a surface coated member having improved stability and a longer service life.

<Method for Manufacturing Surface Coated Member>

A method for manufacturing a surface coated member according to the present invention is a method for manufacturing a surface coated member including a base member and a hard coating formed on a surface thereof and constituted of one or more layers. The method includes a CVD step of forming at least one layer among the layers by a CVD method. The CVD step includes an ejection step of ejecting a mixture gas, which contains two or more kinds of elements selected from the group consisting of a periodic table group 4 element, a periodic table group 5 element, a periodic table group 6 element, and Al, and one or more element selected from the group consisting of B, C, N, and O, to the surface of the base member, and a cooling step of cooling the base member after the ejection step. It should be noted that, the method for manufacturing a surface coated member of the present invention can include other step as long as the above-described CVD step is performed. Other step may include, for example, a thermal treatment step such as annealing, a surface preparation step such as a surface grinding or a shot blasting, and a CVD step for providing another hard layer. In the following, each step of the present invention will be described in detail.

<CVD Step>

The CVD step of the present invention is a step of forming at least one layer among the layers constituting the hard coating of the present invention by the CVD method. In this CVD step, the CVD device shown in FIG. 1 can be used.

Referring to FIG. 1, a plurality of base member setting jigs 3 retaining base members 2 can be provided in a CVD device 1, and these are covered in a reactor vessel 4 made of heat-resistant alloy steel. Moreover, a temperature-adjusting device 5 is arranged around reactor vessel 4, and the temperature in reactor vessel 4 can be controlled by this temperature-adjusting device 5.

In CVD device 1, a feed pipe 8 having two feed ports 6, 7 is arranged. Feed pipe 8 is arranged so as to pass through the region having base member setting jigs 3 arranged therein, and a plurality of through holes are formed in the portion near base member setting jigs 3. In feed pipe 8, each gas introduced into the pipe from feed ports 6, 7 are not mixed in feed pipe 8 and are introduced into reactive vessel 4 through different through holes. Feed pipe 8 can rotate its axis as a center axis. Moreover, an exhaust pipe 9 is arranged in CVD device 1, and exhaust gas can be discharged from an exhaust port 10 of exhaust pipe 9 to outside. It should be noted that, the jigs in reactor vessel 4 are typically made of black lead.

In this step, the CVD device shown in FIG. 1 is used to perform the ejection step and cooling step described below, so that the above-described hard particle layers can be formed.

<Ejection Step>

In this step, with use of the above-described CVD device, mixture gas containing two or more kinds of elements selected from the group consisting of a periodic table group 4 element, a periodic table group 5 element, a periodic table group 6 element, and Al, and one or more kind of element selected from the group consisting of B, C, N, and O is ejected to the surface of the base member.

Specifically, for example, first gas containing two or more kinds of elements selected from the group consisting of a periodic table group 4 element, a periodic table group 5 element, a periodic table group 6 element, and Al is introduced from feed pipe 6 to feed pipe 8, and second gas containing one or more kind of element selected from the group consisting of B, C, N, and O are introduced from feed port 7 to feed pipe 8. It should be noted that the first gas may be mixture gas, for example, first mixture gas of source gas containing the group 4 element, source gas containing the group 5 element, and carrier gas. The second gas may also be mixture gas, for example, second mixture gas of source gas containing B, source gas containing C, and carrier gas.

Since a plurality of through holes are formed in feed pipe 8 on the upper side of the drawing, the introduced first gas (or first mixture gas) and second gas (or second mixture gas) are ejected to reactor vessel 4 from different through holes. At this time, feed pipe 8 is rotated about its axis as indicated by the rotating arrow in the drawing. Therefore, the first gas (or first mixture gas) and second gas (or second mixture gas), as evenly mixture gas, are ejected to the surfaces of base members 2 set on base member setting jigs 3.

As the gas containing two or more kinds of elements selected from the group consisting of a periodic table group 4 element, a periodic group 5 element, a periodic table group 6 element, or Al, chloride gas of these can be favorably used. Moreover, boron chloride gas such as $BCl_3$ gas can be used as gas containing B. Hydrocarbon gas such as $CH_4$ can be used as gas containing C. Gas containing nitrogen such as ammonia or $N_2$ can be used as gas containing N. $H_2O$ (vapor) can be used as gas containing O. It should be noted that the hydrocarbon gas is preferably unsaturated hydrocarbon.

Moreover, in this step, the temperature in reactor vessel 4 is preferably within the range of 700 to 900° C., and the pressure in reactor vessel 4 is preferably 0.1 to 13 kPa. Moreover, $H_2$ gas, $N_2$ gas, and Ar gas can be used as carrier gas. It should be noted that the composition of the first unit layer, second unit layer, intermediate layer, grain boundary layer, and the like can be controlled by a mixing ratio of the source gas. The thickness of the hard particle layer can be controlled by adjusting a flow of the source gas and a film-forming time. The respective thicknesses and layer cycles of the first unit layer, the second unit layer, and the intermediate layer can be controlled by adjusting the film-forming time and the cooling rate. The number of layers of the hard particle layers can be controlled by adjusting the rotating speed of feed pipe 8 and the film-forming time.

<Cooling Step>

Next, in this step, base members 2 are cooled after the ejection step. For example, base members 2 set on base member setting jigs 3 can be cooled by temperature-adjusting device 5. Typically, base members 2 subjected to the thermal CVD treatment in a CVD furnace are cooled naturally by leaving. In this case, the cooling rate does not exceed 5° C./min, and the cooling rate becomes lower as the temperature of base members 2 is lowered. On the other hand, according to the present invention, base members 2 are cooled at a rate which is at least higher than the natural cooling, in other words, cooled at a rate higher than or equal to 5° C./min. More preferably, base members 2 are cooled at a rate higher than or equal to 7° C./m. Moreover, in this cooling step, it is preferable to cool base members 2 at least to the temperature lower than or equal to 300° C. Accordingly, more even hard particle layers can be formed.

The above-described hard particle layers can be formed by the method described above in detail. Therefore, by forming the hard coating with use of the manufacturing method, a surface coated member having improved characteristics such as the wear resistance and welding resistance can be manufactured. Thus, the present invention can provide a surface coated member having improved stability and a longer service life.

EXAMPLES

In the following, examples of the present invention will be described in detail. However, the present invention is not limited to the examples.

<Preparation of Base Member>

A base member A and a base member B described in the Table 1 below were prepared. Specifically, the material powders of the blend compositions described in Table 1 were evenly mixed and press-formed into a predetermined shape, and thereafter sintered at 1300 to 1500° C. for one to two hours, so that base members made of cemented carbide having two kinds of shapes including CNMG120408NUX and SEET13T3AGSN-G were obtained. In other words, two different kinds of shapes were provided for each base member.

Both of the two kinds of shapes described above are manufactured by Sumitomo Electric Hardmetal Division. CNMG120408NUX is a shape of a cutting edge replaceable-type cutting tip for turning, and SEET13T3AGSN-G is a shape of a cutting edge replaceable-type cutting tip for rotary cutting (milling).

TABLE 1

| | | Blend Composition (Mass %) | | | |
|---|---|---|---|---|---|
| | | Co | $Cr_3C_2$ | TaC | WC |
| Super Hard | A | 5.2 | 0.5 | — | Remainder |
| Base Members | B | 10.0 | — | 2.0 | Remainder |

<Formation of Hard Coating>

A hard coating was formed on the surface of each base member obtained as described above. Specifically, the CVD device shown in FIG. 1 was used, and the base members were set on base member setting jigs 3, and a thermal CVD method was conducted to form the hard coating on the base members. The conditions for forming each hard coating were as described in Table 2 and Table 3, and a flow of source gas, a mixing ratio of source gas, a film-forming time, and a cooling rate were adjusted so as to obtain each thickness described in Table 4. It should be noted that Table 2A shows forming conditions for hard particle layers, and Table 2B shows forming conditions for conventional hard layers, and Table 3 shows forming conditions for other layers.

As shown in Table 2A, there were seven forming conditions a to g for the hard particle layers. As shown in FIG. 2B, x and y were conditions for Comparative Examples (Conventional Art). In the forming conditions a to g, $AlCl_3$ gas was used as source gas containing Al, and $TiCl_4$ gas was used as source gas containing Ti, and these source gases were introduced from feed port 6 to feed pipe 8 as first mixture gas together with the carrier gas constituted of $H_2$ gas and $N_2$ gas. Moreover, with use of $NH_3$ gas as source gas containing N, the source gas together with carrier gas constituted of $N_2$ gas were introduced from feed port 7 to feed pipe 8 as the second mixture gas. Then, feed pipe 8 was rotated to allow the first mixture gas and second mixture gas to be ejected from the through holes of feed pipe 8 to thereby eject the mixture gas evenly containing the first mixture gas and second mixture gas toward the surfaces of the base members. After that, with temperature-adjusting device 5, the base member was cooled after the ejection step.

Specifically, in the forming condition a for example, the first mixture gas was obtained by mixing $AlCl_3$ gas of 0.065 mol/min, $TiCl_4$ gas of 0.025 mol/min, and $H_2$ gas and $N_2$ gas of 2.9 mol/min and 1.0 mol/min, and the first mixture gas was introduced from feed pipe 6 into reactor vessel 4. Thus, the atomic ratio of Al/Ti in the first mixture gas was 2.6. Moreover, the second mixture gas was obtained by mixing $NH_3$ gas of 0.09 mol/min and $N_2$ gas of 0.9 mol/min, and the second mixture gas was introduced from feed pipe 7 into reactor vessel 4. Reactor vessel 4 at this time was retained in the condition with the pressure of 1.3 kPa and the temperature of 800° C. Then, the first mixture gas and second mixture gas were ejected from the through holes of feed pipe 3 by the rotation of feed pipe 8, so that mixture gas constituted of evenly mixed first mixture gas and second mixture gas was ejected to the surface of the base member. After that, reactor vessel 4 was cooled at a cooling rate of 10° C./min until the temperature of the base member after the heat ejection step reached 200° C.

Moreover, referring to Table 2A, the forming condition a provides "TiN (2 nm)/AlN (6 nm)." This indicates that the thickness of the TiN layer as the first unit layer was 2 nm, and the thickness of the AlN layer as the second unit layer was 6 nm, and the layers were layered alternately. The "layer cycle" indicates a distance from a midpoint in the thickness direction of TiN layer to a midpoint in the thickness direction of an adjacent TiN layer through one AlN layer, in other words, a sum of the thickness of one TiN layer and the thickness of one AlN layer. It should be noted that the thickness of the hard particle layer was controlled by the film-forming time, and the layer cycle of TiN and AlN in the hard particle layer was controlled by the cooling rate of feed pipe 8.

Moreover, each layer other than the hard particle layers described in Table 3 were also formed in a similar manner except for that all of the gases such as source gas and carrier gas were introduced from feed port 6 and that the base member was cooled by the natural cooling after the thermal CVD treatment. It should be noted that the "Remainder" in Table 3 indicates that $H_2$ takes up the remainder of the source gas (reaction gas). Moreover, "Total Gas Amount" indicates a total amount of flow introduced into the CVD furnace per unit time with gas in the reference condition (0° C., 1 atmospheric pressure) as ideal gas.

In the forming condition x, the hard coating was formed with use of the PVD method disclosed in PTD 1, and the hard coating was formed with use of the CVD method disclosed in PTD 2 in the forming condition y. It should be noted that, in the forming condition x, a layer (AlN/TiN layer) of a layered structure in which the TiN layer having a thickness of 4 nm and the AlN layer having a thickness of 4 nm were alternately layered was formed. In the forming condition y, a layer constituted mainly of the composition of $Ti_{0.1}Al_{0.9}N$ ($Ti_{0.1}Al_{0.9}N$ layer) was formed.

TABLE 2A

| | | Forming Method | Characteristics of Layers — Layer Thickness and Cycle Thickness (nm) | Film-Forming Conditions | | | | | |
|---|---|---|---|---|---|---|---|---|---|
| | | | | First Mixed Gas (mol/min) | Second Mixed Gas (mol/min) | Al/Ti Ratio in Raw Material | Pressure in Furnace (kPa) | Temperature in Furnace (° C.) | Cooling Rate (° C./min) |
| Examples | a | CVD | TiN (2)/AlN (6) Layer Cycle (8) | AlCl$_3$(0.065) TiCl$_4$(0.025) H$_2$(2.9), N$_2$(1.0) | NH$_3$(0.09) N$_2$(0.9) | 2.6 | 1.3 | 800 | 10.0 |
| | b | CVD | TiN (1)/AlN (3.5) Layer Cycle(4.5) | AlCl$_3$(0.065) TiCl$_4$(0.025) H$_2$(2.9), N$_2$(1.0) | NH$_3$(0.09) N$_2$(0.9) | 2.6 | 1.3 | 800 | 15.0 |
| | c | CVD | TiN (10)/AlN (10) Layer Cycle (20) | AlCl$_3$(0.058) TiCl$_4$(0.032) H$_2$(2.9), N$_2$(1.0) | NH$_3$(0.09) N$_2$(0.9) | 1.8 | 2.6 | 830 | 7.0 |
| | d | CVD | TiN (6)/AlN (3) Layer Cycle (9) | AlCl$_3$(0.028) TiCl$_4$(0.062) H$_2$(2.9), N$_2$(1.0) | NH$_3$(0.09) N$_2$(0.9) | 0.45 | 1.3 | 800 | 10.0 |
| | e | CVD | TiN (12)/AlN (8) Layer Cycle (20) | AlCl$_3$(0.034) TiCl$_4$(0.056) H$_2$(2.9), N$_2$(1.0) | NH$_3$(0.09) N$_2$(0.9) | 0.6 | 2.6 | 850 | 7.0 |
| | f | CVD | TiN (2)/AlN (1) Layer Cycle (3) | AlCl$_3$(0.028) TiCl$_4$(0.062) H$_2$(2.9), N$_2$(1.0) | NH$_3$(0.09) N$_2$(0.9) | 0.45 | 1.3 | 800 | 15.0 |
| | g | CVD | TiN (0.5)/AlN (1) Layer Cycle (1.5) | AlCl$_3$(0.065) TiCl$_4$(0.025) H$_2$(2.9), N$_2$(1.0) | NH$_3$(0.09) N$_2$(0.9) | 2.6 | 1.3 | 780 | 20.0 |

TABLE 2B

| | | Forming Method | Characteristics of Layers — Layer Thickness and Cycle Thickness (nm) | Film-forming Conditions | | | | | |
|---|---|---|---|---|---|---|---|---|---|
| | | | | First Mixed Gas (mol/min) | Second Mixed Gas (mol/min) | Al/Ti Ratio in Raw Material | Pressure in Furnace (kPa) | Temperature in Furnace (° C.) | Cooling Rate (° C./min) |
| Conventional Art | x | PVD | TiN (4)/AlN (4) Layer Cycle (8) | — | | | | | |
| | y | CVD | Ti$_{0.1}$Al$_{0.9}$N | AlCl$_3$(0.0009) TiCl$_4$(0.00015) H$_2$(2.9), N$_2$(1.0) | NH$_3$(0.09) N$_2$(0.9) | 6.0 | 1 | 800 | 3.5 (Natural Cooling) |

TABLE 3

| Configuration of Cover Composition | Film-Forming Conditions Reaction Gas Composition (Volume %) | Reaction Atmosphere | | |
|---|---|---|---|---|
| | | Pressure (kPa) | Temperature (° C.) | Total Gas Amount (L/min) |
| TiN(Base Layer) | TiCl$_4$ = 2.0%, N$_2$ = 39.7%, H$_2$ = Remainder | 6.7 | 915 | 63.8 |
| TiN(Outermost layer) | TiCl$_4$ = 0.5%, N$_2$ = 41.2%, H$_2$ = Remainder | 79.8 | 980 | 45.9 |
| TiCN | TiCl$_4$ = 2.0%, CH$_3$CN = 0.7%, H$_2$ = Remainder | 9 | 860 | 50.5 |
| TiBNO | TiCl$_4$ = 36.7%, BCl$_3$ = 0.1%, CO = 1.6%, CO$_2$ = 1.7%, N$_2$ = 61.7%, H$_2$ = Remainer | 6.7 | 980 | 80.3 |
| TiCNO | TiCl$_4$ = 2.1%, CO = 3.2%, CH4 = 2.8%, N$_2$ = 23.7%, H$_2$ = Remainder | 16.0 | 1030 | 70.5 |
| Al$_2$O$_3$ | AlCl$_3$ = 1.6%, CO$_2$ = 4.5%, H$_2$S = 0.2%, HCl = 3.5%, H$_2$ = Remainder | 6.7 | 1000 | 46.2 |

<Production of Surface Coated Member>

A hard coating was formed on the base member in accordance with the above-described conditions of Table 2 and Table 3 to produce a cutting tool as surface coated members of Examples 1 to 15 and Comparative Examples 1 to 6 shown in following Table 4.

For example, the cutting tool of Example 13 employs base member B described in Table 1 as a base member. A TiN layer (base layer) having a thickness of 1.0 μm was formed as a base layer on the surface of base member B in the condition of Table 3. A TiCN layer having a thickness of 3.0 μm was formed on the TiN layer (base layer) in the condition of Table 3. A hard particle layer having a thickness of 5.0 μm was formed on the TiCN layer in the forming condition f of Table 2. A TiN layer (outermost layer) having a thickness of 0.5 μm was formed on the hard particle layer in the condition of Table 3. Accordingly, a hard coating having a total thickness of 9.0 μm was formed on the base member. The blank (hyphen) in Table 4 indicates that the corresponding layer is not formed.

It should be noted that, as to the base layer and the layer including a multilayer structure, there is a layer which has the same composition but different thickness. For example, although the hard particle layer of Example 1 is a layer having a thickness of 5 μm formed by the forming condition a, the hard particle layer of Example 6 is a layer having a thickness of 8 μm formed in forming condition a. The difference in the thicknesses of these layers was controlled by adjusting a forming time of a layer, in other words, a total time of ejecting the first gas and second gas alternately onto the surface of the base member.

Al is considered as TiN, and the region having a higher atomic ratio in Al than Ti is considered as AlN. In other words, the layer constituted of fcc-TiN is changed in its composition from TiN to AlN continuously as it came closer to the adjacent layer constituted of fcc-AlN, and the layer constituted of fcc-AlN was continuously changed in its composition from AlN to TiN as it came closer to the adjacent layer constituted of fcc-TiN. In this case, in the thickness direction of the hard particle layer, the region having the highest atomic ratio in Ti can be considered as the first unit layer, and the region having the highest atomic ratio in Al can be considered as the second unit layer, and the region therebetween having its composition changed can be considered as the intermediate layer.

<Cutting Experiment>

With use of the cutting tool obtained as described above, the following five kinds of cutting experiments were conducted.

TABLE 4

| | | Layer Configuration and Thickness of EachLayer | | | |
|---|---|---|---|---|---|
| | Kind of Base | Base Layer (μm) | Hard Particle Layer (μm) | Outermost Layer (μm) | Total Layer Thickness (μm) |
| Example 1 | A | TiN (0.5)—TiCN (2.5) | a (5.0) | — | 8.0 |
| Example 2 | A | TiN (0.5)—TiCN (2.5) | b (3.0) | — | 6.0 |
| Example 3 | A | TiN (0.5)—TiCN (2.5) | d (7.5) | — | 10.5 |
| Example 4 | A | TiN (0.5)—TiCN (2.5) | f (12.0) | — | 15.0 |
| Example 5 | A | TiN (1.5) | c (10.0) | — | 11.5 |
| Example 6 | A | TiN (1.5) | a (8.0) | — | 9.5 |
| Example 7 | A | TiN (1.5) | g (3.7) | — | 5.2 |
| Example 8 | A | TiN (1.5) | e (15.0) | — | 16.5 |
| Example 9 | A | TiN (0.5)—TiCN (5.0) | d (6.0) | — | 11.5 |
| Example 10 | B | TiN (1.0) | a (5.0) | TiN (1.0) | 6.0 |
| Example 11 | B | TiN (1.0) | d (6.5) | — | 7.5 |
| Example 12 | B | TiN (1.0) | g (5.5) | — | 6.5 |
| Example 13 | B | TiN (1.0)—TiCN (3.0) | f (5.0) | TiN (0.5) | 9.0 |
| Example 14 | B | TiN (1.0)—TiCN (3.0) | a (4.0) | — | 8.0 |
| Example 15 | B | TiN (1.0)—TiCN (3.0) | b (2.5) | TiBN (0.3)—Al$_2$O$_3$ (1.0) | 7.8 |
| Comparative Example 1 | A | — | x (10.0) | — | 10.0 |
| Comparative Example 2 | A | TiN (0.5)—TiCN (2.5) | x (5.0) | — | 8.0 |
| Comparative Example 3 | B | TiN (1.0) | x (5.0) | TiN (1.0) | 7.0 |
| Comparative Example 4 | A | TiN (0.5)—TiCN (2.5) | y (5.0) | — | 8.0 |
| Comparative Example 5 | A | TiN (1.5) | y (10.0) | TiN (0.5) | 11.5 |
| Comparative Example 6 | B | TiN (1.0)—TiCN (3.0) | y (5.0) | — | 9 |

<Observation of Hard Particle Layer>

When the coated hard coating was observed with use of a transmission electron microscope and an X-ray diffraction method, a granular structure constituted of hard particles was observed in the hard particle layer formed in each condition shown in Table 2A. Moreover, each hard particle had a layered structure in which the fcc-TiN and fcc-AlN are alternately layered. Further, a layer made of fine fcc-TiN was present in the grain boundary of each hard particles. On the other hand, in each layer formed in each condition shown in Table 2B, the granular structure was not observed.

It should be noted that, although the respective thicknesses of layers constituted of fcc-TiN and layers constituted of fcc-AlN are shown in Table 2A based on the above-described observation, this is based on that, in the microscope observation, in the region where the layer structure is observed, the region having a higher atomic ratio in Ti than <Cutting Experiment 1>

As to the cutting tools of Examples and Comparative Examples described in the following Table 5 (the base member having a shape of CNMG120408NUX was used), the machining time to obtain the flank wear amount (Vb) of 0.20 mm under the following cutting condition was measured, and the final damage form of the cutting edge was observed. The result is shown in Table 5. It indicates that, as the machining time is longer, the wear resistance is superior. Moreover, it indicates that, as the final damage form is closer to the normal wear, the welding resistance is superior.

<Cutting Conditions>
Work Material: SUS316 round bar outer periphery cutting
Peripheral Speed: 200 m/min
Feed Rate: 0.15 mm/rev
Cutting Amount: 1.0 mm
Cutting Liquid: Present

TABLE 5

| | Cutting Time (min) | Final Damage Form |
|---|---|---|
| Example 1 | 17.0 | Normal Wear |
| Example 3 | 15.0 | Normal Wear |
| Example 7 | 19.0 | Normal Wear |
| Example 9 | 20.0 | Normal Wear |
| Comparative Example 1 | 7.0 | Normal Wear |
| Comparative Example 2 | 6.0 | Fracture |
| Comparative Example 4 | 13.0 | Normal Wear |

As is clear from Table 5, the cutting tools of the Examples according to the present invention were, as compared to the cutting tools of Comparative Examples, superior in both the wear resistance and welding resistance, and had improved stability and a longer service life. It should be noted that, in the final damage form of Table 5, the "Normal Wear" indicates a damage form constituted of only wear without occurrence of chipping or loss (having a smooth worn surface), and the "Fracture" indicates a large loss occurred in the cutting edge.

<Cutting Experiment 2>

As to the cutting tools of the Examples and Comparative Examples described in the following Table 6 (the base member having a shape of CNMG120408NUX is used), the machining time to obtain the flank wear amount (Vb) of 0.20 mm under the following cutting condition was measured, and the final damage form of the cutting edge was observed. The result is shown in Table 6. It indicates that, as the machining time is longer, the wear resistance is superior. Moreover, it indicates that, as the final damage form is closer to the normal wear, the welding resistance is superior.

<Cutting Conditions>
Work Material: FCD700 round bar outer periphery cutting
Peripheral Speed: 150 m/min
Feed Rate: 0.15 mm/rev
Cutting Amount: 1.0 mm
Cutting Liquid: Present

TABLE 6

| | Cutting Time (min) | Final Damage Form |
|---|---|---|
| Example 1 | 18.0 | Normal Wear |
| Example 4 | 23.0 | Normal Wear |
| Example 5 | 20.0 | Normal Wear |
| Example 8 | 17.0 | Normal Wear |
| Comparative Example 2 | 9.0 | Fracture |
| Comparative Example 4 | 13.0 | Front Boundary Fine Chipping |

As is clear from Table 6, the cutting tools of the Examples according to the present invention were, as compared to the cutting tools of Comparative Examples, superior in both the wear resistance and welding resistance, and had improved stability and a longer service life. It should be noted that, in the final damage form of Table 6, the "Normal Wear" indicates a damage form constituted of only wear without occurrence of chipping or loss (having a smooth worn surface), and the "Fracture" indicates a large loss occurred in the cutting edge, and the "Front Boundary Fine Chipping" indicates fine chipping occurred in the cutting edge part forming the machined surface.

<Cutting Experiment 3>

As to the cutting tools of Examples and Comparative Examples described in the following Table 7 (the base member having a shape of CNMG120408NUX was used), the machining time (minute) to occurrence of fracture or chipping in the tool cutting edge under the following cutting condition was measured. The result is shown in Table 7. It indicates that, as the machining time is longer, the fatigue resistant toughness is superior.

<Cutting Conditions>
Work Material: SCM435 groove material
Cutting Speed: 200 m/min
Feed Rate: 0.3 mm/s
Cutting Amount: 1.0 mm
Cutting Liquid: Present

TABLE 7

| | Cutting Time (min) |
|---|---|
| Example 1 | 6.0 |
| Example 2 | 7.0 |
| Example 3 | 4.0 |
| Example 5 | 4.0 |
| Example 6 | 4.5 |
| Comparative Example 2 | 5.0 |
| Comparative Example 4 | 3.0 |
| Comparative Example 5 | 1.0 |

As is clear from Table 7, the cutting tools of the Examples according to the present invention were, as compared to the cutting tools having hard coating formed by the conventional CVD method, superior in the fatigue resistant toughness, and therefore were had improved stability and a longer service life.

<Cutting Experiment 4>

As to the cutting tools of the Examples and Comparative Examples described in the following Table 8 (the base member having the shape of ET13T3AGSN-G was used), the path number and cutting distance to obtain the cutting or flank wear amount (Vb) of 0.20 mm under the following cutting condition was measured, and the final damage form of the cutting edge was observed. The result is shown in Table 8. It indicates that, as the path number is larger (as the cutting distance is longer), the wear resistance is superior. Moreover, it indicates that, as the final damage form is closer to the normal wear, the shock resistance is superior.

It should be noted that the path number is obtained by repeatedly performing the rotational cutting with use of a cutter having one cutting tool (a cutting edge replaceable-type cutting tip) from one end to the other end of one side surface (the surface of 300 mm×80 mm) of the following work material (shape: a block-like shape of 300 mm×100 mm×80 mm) and obtaining the frequency of repetition (the path number with a value after the decimal point indicates that the above-described condition is obtained on the way from one end to the other end). The cutting distance indicates a total distance of the work material cut before reaching the above-described condition and corresponds to a product of the path number and the die length (300 mm) of the above-described side surface.

<Cutting Conditions>
Work Material: FC250 block material
Peripheral Speed: 300 m/min
Feed Rate: 0.3 mm/s
Cutting Amount: 2.0 mm
Cutting Liquid: Present
Cutter: WGC4160R (manufactured by Sumitomo Electric Hardmetal Division)

TABLE 8

|  | Path Number | Cutting Distance(m) | Final Damage Form |
| --- | --- | --- | --- |
| Example 10 | 12.6 | 3.8 | Normal Wear |
| Example 11 | 11.5 | 3.5 | Normal Wear |
| Example 13 | 14.0 | 4.2 | Normal Wear |
| Example 15 | 15.0 | 4.5 | Normal Wear |
| Comparative Example 3 | 6.0 | 1.8 | Normal Wear |
| Comparative Example 6 | 8.0 | 2.4 | Normal Wear |

As is clear from Table 8, the cutting tools of the example according to the present invention were, as compared to the cutting tools of the Comparative Examples, superior in the wear resistance, and therefore had improved stability and a longer service life. It should be noted that, in the final damage form of Table 8, the "Normal Wear" indicates a damage form constituted only of wear without chipping or loss (having a smooth worn surface).

<Cutting Experiment 5>

As to the cutting tools of the Examples and Comparative Examples described in the following Table 9 (the cutting tool having the shape of SEET13T3AGSN-G was used), the path number and cutting distance to obtain the cutting or flank wear amount (Vb) of 0.20 mm under the following cutting condition was measured, and the final damage form of the cutting edge was observed. The result is shown in Table 9. It indicates that, as the path number is larger (in other words, the cutting distance is longer), the wear resistance is superior. Moreover, it indicates that, as the final damage form is closer to the normal wear, the shock resistance is superior.

<Cutting Condition>
Work Material: SUS304 block material
Peripheral Speed: 160 m/min
Feed Rate: 0.3 mm/s
Cutting Amount: 2.0 mm
Cutting Liquid: Absent
Cutter: WGC4160R (manufactured by Sumitomo Electric Hardmetal Division)

TABLE 9

|  | Path Number | Cutting Distance(m) | Final Damage Form |
| --- | --- | --- | --- |
| Example 10 | 7.0 | 2.1 | Normal Wear |
| Example 12 | 8.0 | 2.4 | Normal Wear |
| Example 13 | 10.0 | 3.0 | Normal Wear |
| Example 14 | 11.0 | 3.3 | Normal Wear |
| Comparative Example 3 | 2.5 | 0.8 | Chipping |
| Comparative Example 6 | 5.5 | 1.7 | Chipping |

As is clear from Table 9, the cutting tools of the Examples according to the present invention were, as compared to the cutting tools of the Comparative Examples, were superior in both the wear resistance and shock resistance, and had improved stability and a longer service life. It should be noted that, in the final damage form of Table 9, the "Normal Wear" indicates a damage form constituted of only wear without occurrence of chipping or loss, and the "chipping" indicates a small loss occurred in the cutting edge part.

As described above, the embodiment and examples of the present invention were described. However, the appropriate combinations of each embodiment and example described above was expected from the original.

It is to be understood that the embodiments and examples disclosed herein are only by way of example in all aspects, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST

1 CVD device; 2 base member; 3 base member setting jig; 4 reactor vessel; 5 temperature-adjusting device; 6, 7 feed port; 8 feed pipe; 9 exhaust pipe; 10 exhaust port.

The invention claimed is:

1. A surface coated member comprising a base member and a hard coating formed on a surface thereof,
    said hard coating being constituted of one or more layers,
    at least one layer among said layers being a layer consisting of hard particles,
    said hard particles including therein a multilayer structure having first unit layers and second unit layers being layered alternately,
    said first unit layer including a first compound, said first compound being made of one or more kind of element selected from the group consisting of a periodic table group 4 element, a periodic table group 5 element, a periodic table group 6 element, and Al, and one or more kind of element selected from the group consisting of B, C, N, and O,
    said second unit layer including a second compound, said second compound being made of one or more kind of element selected from the group consisting of a periodic table group 4 element, a periodic table group 5 element, a periodic table group 6 element, and Al, and one or more kind of element selected from the group consisting of B, C, N, and O, and
    said first compound and said second compound differing by at least one element selected from the group consisting of the periodic table group 4 element, the periodic table group 5 element, the periodic table group 6 element, and Al.

2. The surface coated member according to claim 1, wherein
    said first compound has an fcc crystal structure and said second compound has an fcc crystal structure.

3. The surface coated member according to claim 2, wherein
    said first unit layer and said second unit layer form a region represented by $Ti_xAl_yN$, in which the atomic ratio x of Ti continuously decreases from 1 to 0 and the atomic ratio y of Al continuously increases from 0 to 1 from said first unit layer to said second unit layer.

4. The surface coated member according to claim 3, wherein
    said region having the atomic ratio x/y of Ti and Al greater than or equal to 1 is said first unit layer, and said region having the atomic ratio x/y of less than 1 is said second unit layer.

5. The surface coated member according to claim 1, wherein
    a thickness of said layer cycle representing a distance from one first unit layer to other adjacent first unit layer across said second unit layer is greater than or equal to 0.5 nm and less than or equal to 20 nm.

6. The surface coated member according to claim 1, wherein
    said first compound is made of TiN and said second compound is made of AlN.

* * * * *